United States Patent
Mellinger et al.

(10) Patent No.: US 11,313,890 B2
(45) Date of Patent: Apr. 26, 2022

(54) CONTROL VALVE

(71) Applicant: SAMSON AG, Frankfurt am Main (DE)

(72) Inventors: Christian Mellinger, Obertshausen (DE); Harald Kah, Brechen (DE)

(73) Assignee: SAMSOON AG, Frankfurt am Main (DE)

(*) Notice: Subject to any disclaimer, the term of this patent is extended or adjusted under 35 U.S.C. 154(b) by 135 days.

(21) Appl. No.: 16/108,533

(22) Filed: Aug. 22, 2018

(65) Prior Publication Data

US 2019/0086456 A1 Mar. 21, 2019

(30) Foreign Application Priority Data

Aug. 22, 2017 (DE) .................... 10 2017 119 205.0

(51) Int. Cl.
*G01R 27/20* (2006.01)
*F16K 37/00* (2006.01)
(Continued)

(52) U.S. Cl.
CPC ............ *G01R 27/20* (2013.01); *F16K 1/12* (2013.01); *F16K 1/38* (2013.01); *F16K 31/1262* (2013.01);
(Continued)

(58) Field of Classification Search
None
See application file for complete search history.

(56) References Cited

U.S. PATENT DOCUMENTS

| 3,919,885 A * | 11/1975 | Kaireit | F02D 41/22 |
| | | | 73/114.45 |
| 6,113,066 A * | 9/2000 | Hohl | B60T 8/363 |
| | | | 251/129.02 |

(Continued)

FOREIGN PATENT DOCUMENTS

| DE | 20007204 U1 | 8/2000 |
| EP | 0 096 366 A2 | 12/1983 |

(Continued)

OTHER PUBLICATIONS

Kaneko, Yutaka, Hygienic Val Ve Having Leakage Detection,International Publication Date: Oct. 23, 1997,TETRA Laval Holdings & Finances.A. [CH/CH], WO 97/39267, CPC: F16K 23/00 (Year: 1997).*

(Continued)

*Primary Examiner* — Nasima Monsur
(74) *Attorney, Agent, or Firm* — Juan Carlos A. Marquez; Marquez IP Law Office, PLLC

(57) ABSTRACT

The invention relates to a control valve for adjusting a process fluid flow of a process plant, comprising a valve housing (8) with a valve seat (14) and a valve member (16) connected to a valve rod (18), which cooperates with the valve seat (14) for opening and closing the control valve (2), wherein the valve rod (18) is electrically connected to the valve housing (8) through a contact device (42, 43, 45). The invention is characterized in that a measuring device (26) for the ohmic transition resistance measurement of the contact device (42, 43, 45) is provided, and that the measuring device (26) is arranged in a measuring line (24) that connects the valve housing (8) to the valve rod (18).

14 Claims, 3 Drawing Sheets

(51) Int. Cl.
    *F16K 1/12*       (2006.01)
    *F16K 1/38*       (2006.01)
    *F16K 51/00*      (2006.01)
    *H05F 3/02*       (2006.01)
    *F16K 31/126*     (2006.01)
    *G01R 13/02*      (2006.01)

(52) U.S. Cl.
    CPC .......... *F16K 37/0041* (2013.01); *F16K 51/00* (2013.01); *G01R 13/0209* (2013.01); *H05F 3/02* (2013.01)

(56) References Cited

U.S. PATENT DOCUMENTS

| | | | | |
|---|---|---|---|---|
| 2003/0136929 A1* | 7/2003 | Clemens | .............. | G05B 19/291 251/129.04 |
| 2012/0001103 A1* | 1/2012 | Kiesbauer | ........... | F16K 31/1262 251/12 |
| 2013/0009080 A1* | 1/2013 | Schrobenhauser | ....... | F15B 9/12 251/30.01 |

FOREIGN PATENT DOCUMENTS

| EP | 0501817 A1 | 9/1992 |
|---|---|---|
| JP | S5617463 U | 2/1981 |
| JP | H04262182 A | 9/1992 |
| WO | 9739267 A1 | 4/1997 |

OTHER PUBLICATIONS

European Search Report dated Jan. 21, 2019, by the European Patent Office in corresponding European application EP 18 19 0119, 7 pages in German.

* cited by examiner

CONTROL VALVE

The invention relates to a control valve for adjusting a process fluid flow in a process plant.

Static charges in or on the valve may lead to the formation of sparks and thus result in a critical condition. Therefore, it must be ensured that the valve body is safely grounded with the pipe in every position, even though there is no direct contact to the housing via a metal valve seat in the open state of the valve. In current practice, the transition resistance is measured once on delivery of the product so as to verify safe grounding between the actuator and the valve housing. The ohmic resistance of the transition resistance must not exceed 10 ohms. However, there is no monitoring overtime, i.e. the ohmic resistance of the grounding between the moving valve parts and the housing is not verified.

EP 83105457 relates to an electrostatic draining device for cocks with a spherical surface having a contact element between a ball valve and a spindle, and a second contact element between the spindle and a stuffing box, wherein at least the contact element between the ball and the spindle consists of two metal pins that are guided in a bushing and that are pressed into contact with the ball and with the spindle by means of a spring arranged between the two metal pins so that the spring is not exposed to aggressive fluids. This arrangement only ensures the draining of electrostatic charges; however, it is not designed for the event that the contact between the parts involved in the conduction of current may change over time.

It is the object of the invention to provide a control valve in which the ohmic transition resistance between the valve rod and the grounded housing can be determined to prevent static charging in the control valve and thus the risk of explosion.

This object is accomplished by the characterizing features of claim 1 in combination with the features of its preamble.

The sub-claims define advantageous further developments of the invention.

In a known manner, the control valve according to the invention for adjusting a process fluid flow in a process plant comprises a valve housing with a valve seat and a valve member connected to a valve rod which valve member cooperates with the valve seat for opening and closing the control valve. The valve rod is electrically connected to the valve housing through a contact device.

According to the invention, a measuring device for the ohmic measurement of the transition resistance of the contact device is provided, which measuring device is arranged in a measuring line connecting the valve housing with the valve rod.

The measuring line is provided as a conduction path between the valve rod, on the one hand, and a grounded component, in particular the grounded valve housing, or on a component of the control valve connected to the valve housing, on the other hand. The measuring line can thus also be routed through one or plural components of the control valve that are electrically connected to the valve rod.

The invention allows constant monitoring of the transition resistance between the valve rod and the grounded housing, which is in particular of the stationary type, so that any imminent explosion hazard can be determined immediately.

The contact device is usually provided in the form of a stuffing box packing and/or indirectly via the actuating drive. The contact device can also comprise a sliding contact, for example in the form of a spring plate, which electrically connects the valve rod to the housing.

An advantageous embodiment of the control valve of the invention is characterized in that the measuring line extends to the valve housing from the valve rod via the measuring device and via a yoke connected to the valve housing or via an actuating drive connected to the valve housing. The measuring line can thus be chosen as required.

The measuring line may preferably comprise components of a positioner connected to the valve rod. Parts of a mechanical stroke pick-up of a positioner, which parts are electrically connected to the valve rod, can thus form part of the measuring line. The stroke pick-up may comprise a lever arm which contacts the valve rod via a so-called conductive elevating roller, in particular via a stroke pick-up member member. The lever arm is connected to a shaft in a rotationally fixed and electrically conductive way, which shaft is rotatably mounted in a respective bearing of the positioner. The measuring the extends from the valve rod via the elevating roller, the lever arm via the shaft, where it is connected to the housing of the control valve via the measuring device, by means of sliding contacts.

Advantageously, part of the measuring line is formed by components that are already present so that no additional contacting of the axially moved valve rod is required.

Preferably, the valve housing and the measuring line can be connected via "ground". If the valve housing is grounded, the measuring line can thus end physically at any grounded contact on the control valve.

According to a further embodiment, the lever arm can be spring-loaded against the valve housing, in particular against the positioner housing (in an electrically insulated manner), by means of a torsional spring. In this case, the measuring line may extend from the lever arm via the torsional spring, thus eliminating the need to contact the shaft using a sliding contact, which is a wear-prone solution. Since the stroke pick-up member, the rotary lever with the elevating roller and the shaft of the stroke pick-up means are all components of the positioner, the measuring line can thus be designed advantageously to have only one additional component, i.e. the sliding contact or the torsional spring, respectively.

Preferably, the measuring line may comprise a contact point for mounting an electrical circuit board in the positioner, or a connection point on the interior wall of the positioner. These locations are particularly well-suited because they are located inside the positioner, are thus protected and will not interfere with the further design of the control valve.

More specifically, the measuring device for measuring the ohmic transition resistance comprises a first transformer and a second transformer. The measuring line is designed in such a way that it forms a secondary winding of the first transformer and a primary winding of the second transformer. A voltage pulse impressed on the first transformer by a pulse source thus provides a measured value on the second transformer that is dependent on the resistance of the loop formed by the contact device and the measuring line, in particular of the ground loop. Therefore a known measurement circuit can be used in an advantageous way to monitor the transition resistance between the valve rod and the valve housing in the inventive valve, with measurement circuits of this kind being known from EP 2 249 170 A1.

For a control valve in which the contact device comprises an electrically conductive ground strap that connects the valve rod to the yoke or to the valve housing, it is considered advantageous for the control valve to comprise a measuring device of the above mentioned type because the measuring device will thus also detect any ground strap breakage.

Another advantageous embodiment of the inventive control valve is characterized in that the measuring device for measuring the ohmic transition resistance comprises an evaluation device which is configured to calculate a measured value of the resistance of the ground loop and to output it on a display device. The measured transition resistance values can therefore be processed and displayed promptly in an advantageous way.

Preferably, the measuring device may be incorporated into the positioner.

Yet another advantageous embodiment of the inventive control valve is characterized in that a display device for displaying the measured values is provided directly on the positioner so that an operator can determine directly on the control valve whether the latter still meets functional requirements with regard to transition resistance.

Another advantageous embodiment of the inventive control valve is characterized in that a switching threshold is defined in the evaluation device, and that the evaluation device is configured to emit, in particular to display and/or to send, an alarm signal if the switching threshold is exceeded, with the result that a critical status of the transition resistance of the control valve can also be indicated by an alarm and/or transferred to a remote control center.

The evaluation device may advantageously be configured such that the measured values can be transmitted to a (remote) evaluation station or a control room over a bus system or via a wireless connection.

Additional advantages, features and possible applications of the present invention can be gathered from the description which follows, in which reference is made to the embodiments illustrated in the drawings.

Throughout the description, the claims and the drawings, those terms and associated reference characters are used as are indicated in the List of Reference Characters which follows below. In the drawings FIG. 1 is a side view of an inventive control valve according to a first embodiment of the invention;

Figure 1:
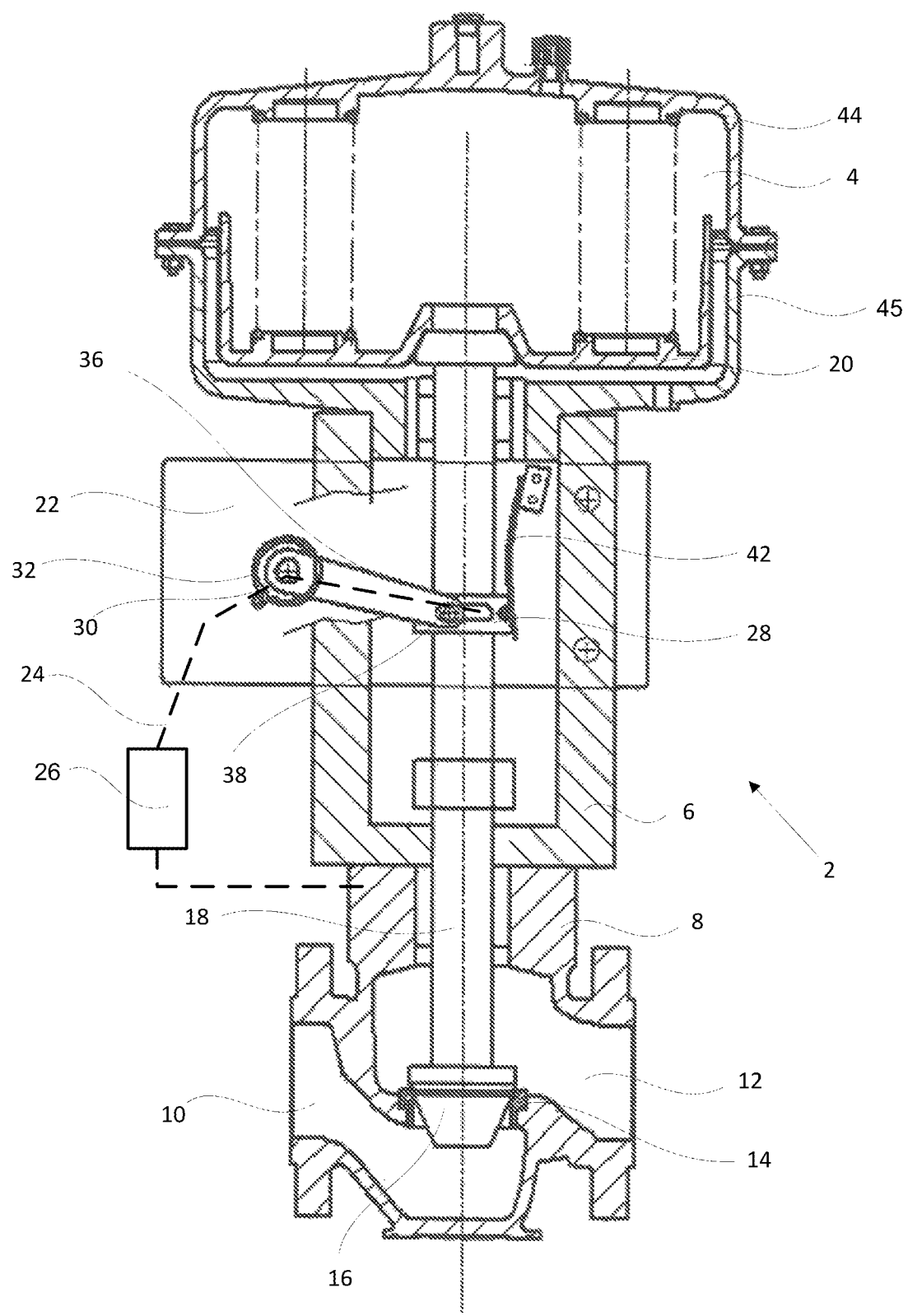

The control valve 2 shown in the drawings comprises an actuating drive 4 and a valve housing 8 connected to the actuating drive 4 via a yoke 6 and having an inlet 10 and an outlet 12 and a valve seat 14 which can be closed or opened by means of a valve member 16, and which is actuated by a valve rod 18 connected to the valve member 16 and the actuating drive 4. For this purpose, the valve rod 18 is connected to a diaphragm working element 20 of the actuating drive 4. In known manner, the control valve 2 is completed by a positioner 22.

In control valves of this type, the valve rod 18 is electrically connected to the valve housing 8 via a contacting device 42. According to the invention, the transition resistance of the electrical contacting device 42 is constantly monitored by measuring the transition resistance between the valve rod 18 and the grounded housing 8.

A measuring line 24 is provided as a conductor path between the valve rod 18, or a component of the control valve 2 that is electrically connected to the valve rod 18, on the one hand, and the grounded valve housing 8, or a component of the control valve 2 that is connected to the valve housing, on the other hand.

Figure 4:
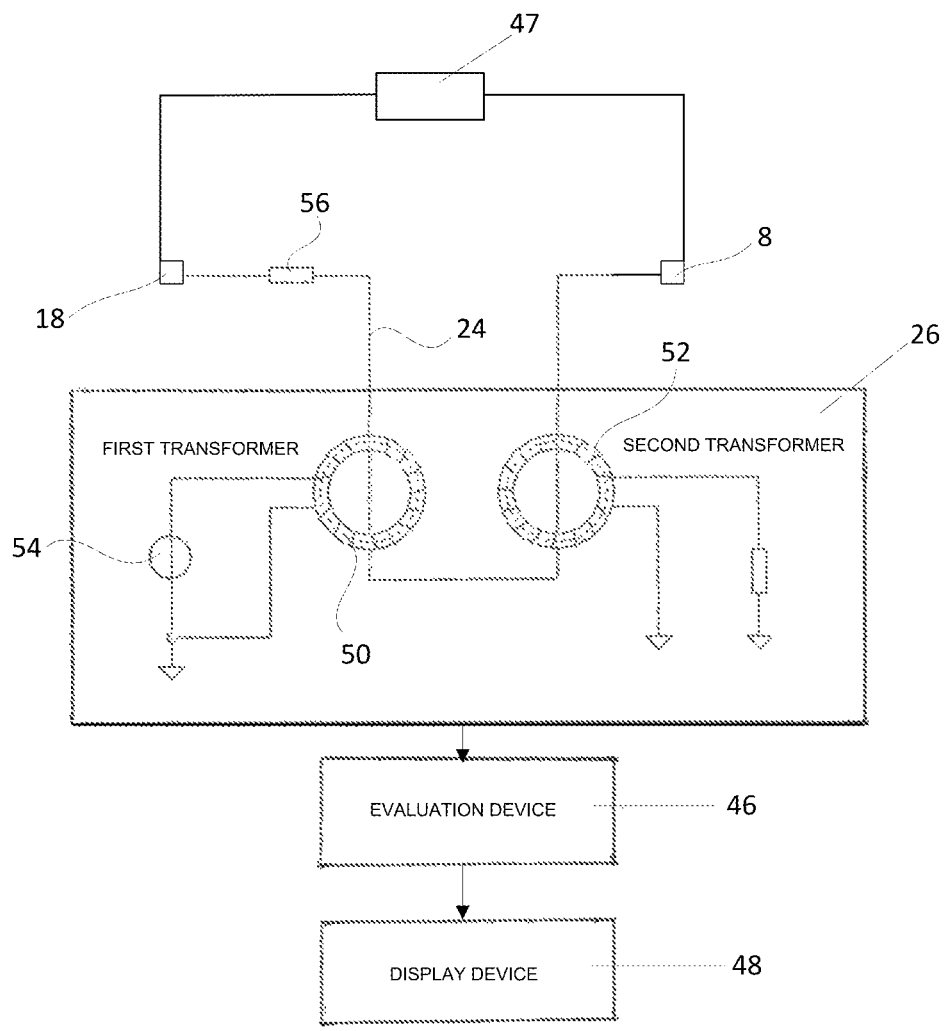
FIG. 4 is a circuit diagram of a measurement and elevation circuit used in the inventive control valve.

As seen in FIG. 1 and/or FIG. 4, the measuring line 24 (shown as a dashed line) extends from the valve rod 18 via a schematically shown measuring device 26 to the actuating drive 4 connected to the valve housing 8. In particular, the measuring line 24 extends through the stroke pick-up member 28 of the positioner 22 on the valve rod 18, the measuring device 26 to the positioner 22 which is permanently connected to the actuating drive 4. As an alternative, the measuring line 24 may extend to the yoke 6 connected to the valve housing 8.

Figure 2:
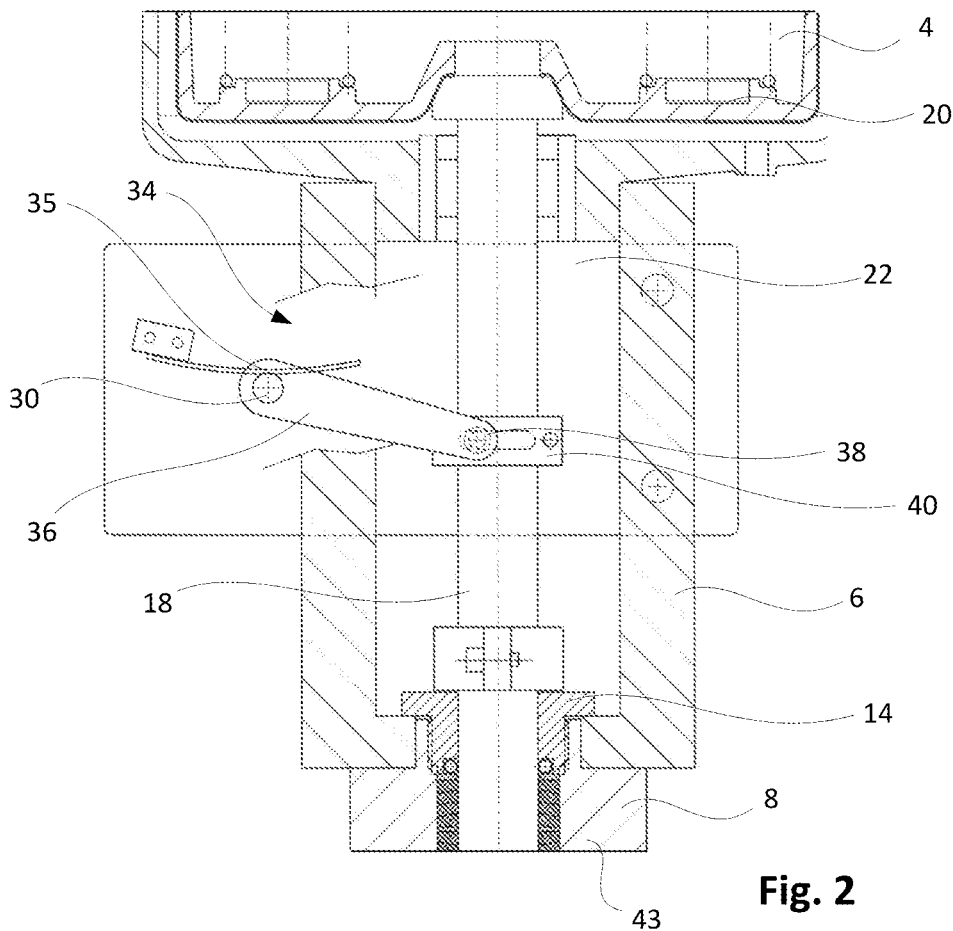
FIG. 2 is a detail view of an area of the inventive control valve according to a second embodiment, which view shows the area of the control valve where contact is made to the valve control rod.

As seen in FIG. 2, the measuring line 24 (FIG. 4) extends to the valve housing 8 from the valve rod 18 via a stroke pick-up member 28 of a positioner 22 on the valve rod 18, a rotary lever 36 of the positioner 22 which is connected to the stroke pick-up member 28 on the valve rod 18 via an elevating roller 38, a shaft 30 of the stroke pick-up 34 guided by the positioner 22, a sliding contact 35 engaging the shaft 30, the measuring device 26 and the positioner 22 permanently connected to the actuating drive 4. More specifically, the measuring device is connected to the interior wall of the positioner 22, or to a contact point for mounting an electrical circuit board (not shown) in the positioner 22.

Figure 3:
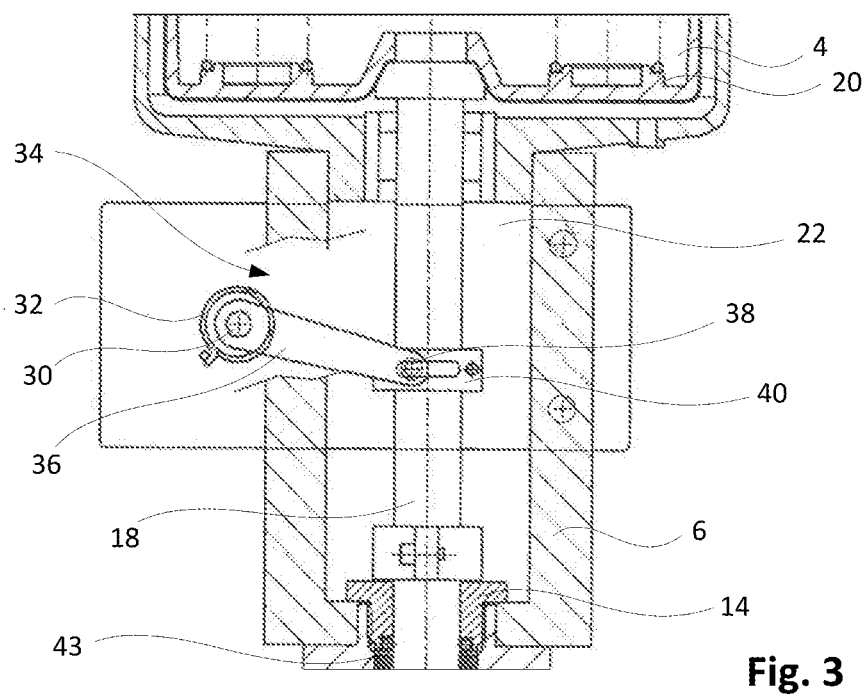
FIG. 3 is a detail view of an area of the inventive control valve according to a third embodiment, which view shows the area of the control valve where contact is made to the valve rod.

As seen in FIG. 3, the measuring line 24 (FIG. 4) extends from the valve rod 18 to the valve housing 8 via the stroke pick-up member 28 of a positioner 22 on the valve rod 18, the rotary lever 36 of the positioner 22 which is connected to the stroke pick-up member 28 on the positioner 22 via an elevating roller 38, the shaft 30 of the stroke pick-up means 34 guided by the positioner 22, a torsional spring 32 which extends about the shaft 30 of the stroke pick-up means 34 guided by the positioner 22, the measuring device 26 and the positioner 22 permanently connected to the actuating drive 4.

In the above described control valves 2 according to the invention, the stroke pick-up member 28, the elevating roller 38, the rotary lever 36, the shaft 30 and the sliding contact 35 and/or the torsional spring 32 are made of an electrically conductive material and are insulated with respect to the positioner, and are connected to the positioner 22 and/or the valve housing 8 via the insulated measuring device 26. Although an additional transition resistance is added between the valve rod 18 and the sliding contact 35 or the torsional spring 32, the device will be safe if the total transition resistance is less than 10 ohms.

The contact points on the housing of the positioner 22, on the yoke 6 or on the actuating drive 4, or on the valve housing 8 itself are designed to have a low transition resistance. Connection can be made either via uncoated spots on the mountings or via an additional ground line.

The above described measuring device 26 in the control valve according to the invention can also be used in a control valve which, in known manner, comprises an electrically conductive ground strap (not shown) that connects the valve rod 18 to the yoke 6 or to the valve housing 8, where a fracture of the ground strap is detected by the measuring device 26.

In the above described control valves 2 of the invention, the contact device between the valve rod 18 and the valve housing 8 may comprise a sliding contact 42 which engages a component connected to the valve rod 18, for example the stroke pick-up member 28, and is connected to the valve housing 8, as is shown in FIG. 1. The contact device may also comprise an electrically conductive stuffing box 43 between the valve rod 18 and the valve housing 8, as shown in FIGS. 2 and 3. Lastly, the electrical contact between the valve rod 18 and the valve housing 8 may also comprise the valve plate 20 connected to the valve rod, a positioning spring 44 of the actuating drive 4 which spring 44 is connected to the valve plate 20, and an actuator housing 45 being in contact with the positioning spring 44.

As shown in FIG. 4, for the purpose of measuring the ohmic transition resistance which is represented by the resistance 47 in FIG. 4, the measuring device 26 is arranged in the measuring line 24. The measuring device 26 is connected to an evaluation device 46 in which a measured value of the transition resistance of the contact device is calculated, and to a display device 48 which is provided for displaying the measured values directly on the positioner 22.

As seen in FIG. 4, the measuring device 26 comprises a first transformer 50 and a second transformer 53, with a ground loop being formed by the measuring line 43 and the contact device, the resistance of which consists of the line resistance 56 of the measuring line 24 and the transition resistance of the contact device and which extends through the first transformer 50 and the second transformer 52.

A voltage pulse impressed on the first transformer 50 by a pulse source 54 delivers a measured value to the second transformer 52 which value is dependent on the resistance of the ground loop. By way of transformers, a voltage pulse is thus impressed on the electrical connection to be monitored between the valve rod 18 and the valve housing 8. The wiring of the transformers is known per se, see EP 2 249 170 A1.

The required voltage pulse is of a length of about 1 µs, and the primary voltage is small, i.e. typically smaller than 3V. In this case, the energy required for a pulse is smaller than 2 nJ (measured value). Even at a measuring rate of 500/s, the average power consumption for providing the pulse will thus be below 1 µW (=2 nJ/2 ms). Only a very small voltage will thus be induced in the ground loop, typically smaller than 100 mV. This eliminates the risk of ignition when the measuring line 24 and/or the ground loop is open.

A pulse current of e.g. 100 mV/10 ohms=10 mA flows in the ground loop. This pulse current is detected by the second transformer. Since the induced voltage only depends on the number of turns of the primary winding, the output is directly dependent on the resistance of the ground loop.

In the evaluation device 46, a switching threshold is defined, for example 10 ohms, with the result that, if the transition resistance exceeds the switching threshold, an alarm signal will be emitted and displayed and/or sent. The measured values will therefore be transmitted to a display device 48, to an evaluation station or to a control room via a bus line (for example Hart, Profibus, CAN, Ethernet or the like) or through a wireless connection (for example Wireless Hart, Bluetooth, NC, WIFI, RFID or the like).

LIST OF REFERENCE CHARACTERS 2 control valve
4 actuating drive
6 yoke
8 valve housing
10 inlet
12 outlet
14 valve seat
16 valve member
18 valve rod
20 diaphragm working element
22 positioner
24 measuring line
26 measuring device
28 stroke pick-up member
30 shaft
32 torsional spring
34 stroke pick-up means
35 sliding contact
36 rotary lever
38 elevating roller
42 sliding contact
43 stuffing box
44 positioning spring
45 valve drive housing
46 evaluation device
47 transition resistance
48 display device
50 first transformer
52 second transformer
54 pulse source
56 line resistance

The invention claimed is:

1. A control valve for adjusting a process fluid flow of a process plant, comprising a valve housing with a valve seat and a valve member connected to a valve rod, which cooperates with the valve seat for opening and closing the control valve,
   wherein the valve rod, a positioner connected to the valve rod, a stroke pickup member connected to the positioner a measuring device between a rotary lever and the valve housing and the valve housing are continuously electrically connected to each other,
   wherein the measuring device is configured to continuously measure an ohmic resistance of the continuous electrical connection therebetween, and the measuring device is arranged in a measuring line that connects the valve housing to the valve rod, and
   wherein the valve rod is continuously electrically connected to the valve housing via the stroke pick-up member of the positioner on the valve rod, the rotary lever of the positioner which is continuously electrically connected to the stroke pick-up member on the valve rod via an elevating roller, a shaft of the stroke pick-up member guided by the positioner, a sliding contact engaging the shaft, the measuring device and the positioner permanently connected to the actuating drive.

2. The control valve according to claim 1, wherein the measuring device for measuring the ohmic transition resistance comprises a first transformer and a second transformer, wherein the measuring line forms a secondary winding of the first transformer and a primary winding of the second transformer, whereby a voltage pulse impressed on the first transformer by a pulse source delivers a measured value on the secondary winding of the second transformer, which measured value is dependent on the resistance of the ground loop formed by the contact device and the measuring line.

3. The control valve according to claim 1, wherein an evaluation device is connected to the measuring device for measuring the ohmic transition resistance, said evaluation device being configured to calculate the measured value of the resistance of the ground loop and to output it via a display device.

4. The control valve according to claim 3, wherein the display device for displaying the measured values is provided directly on the positioner.

5. The control valve according to claim 3, wherein a switching threshold of e.g. 10 ohms is defined in the evaluation device, and that the evaluation device is configured to emit, in particular to display and/or to send, an alarm signal if the switching threshold is exceeded.

6. The control valve according to claim 3, wherein the evaluation device is configured to transmit the measured values to an evaluation station or to a control room via a bus system or a wireless connection.

7. The control valve according to claim 1, wherein the measuring line comprises a contact point for mounting an electrical circuit board in the positioner or a contact point on the interior wall of the positioner.

8. A control valve for adjusting a process fluid flow of a process plant, comprising a valve housing with a valve seat and a valve member connected to a valve rod, which cooperates with the valve seat for opening and closing the control valve, wherein the valve rod, a positioner connected to the valve rod, a stroke pickup member connected to the positioner, a measuring device between a rotary lever and the valve housing and the valve housing are continuously electrically connected to each other, wherein the measuring device is configured to continuously measure an ohmic resistance of the continuous electrical connection therebetween, and the measuring device is arranged in a measuring line that connects the valve housing to the valve rod, and wherein the valve rod is continuously electrically connected to the valve housing via the stroke pick-up member of the positioner on the valve rod, the rotary lever of the positioner which is continuously electrically connected to the stroke pick-up member on the positioner via an elevating roller, a shaft of the stroke pick-up member guided by the positioner, an electrically conducting torsional spring which extends around an electrically conducting shaft of the stroke pick-up member guided by the positioner, the measuring device and the positioner permanently connected to the actuating drive.

9. The control valve according to claim 8, wherein the measuring line comprises a contact point for mounting an electrical circuit board in the positioner, or a contact point on the interior wall of the positioner.

10. The control valve according to claim 8, wherein the measuring device for measuring the ohmic transition resistance comprises a first transformer and a second transformer, wherein the measuring line forms a secondary winding of the first transformer and a primary winding of the second transformer, whereby a voltage pulse impressed on the first transformer by a pulse source delivers a measured value on the secondary winding of the second transformer, which measured value is dependent on the resistance of the ground loop formed by the contact device and the measuring line.

11. The control valve according to claim 8, wherein an evaluation device is connected to the measuring device for measuring the ohmic transition resistance, said evaluation device being configured to calculate the measured value of the resistance of the ground loop and to output it via a display device.

12. The control valve according to claim 11, wherein the display device for displaying the measured values is provided directly on the positioner.

13. The control valve according to claim 11, wherein a switching threshold of e.g. 10 ohms is defined in the evaluation device, and that the evaluation device is configured to emit, in particular to display and/or to send, an alarm signal if the switching threshold is exceeded.

14. The control valve according to claim 11, wherein the evaluation device is configured to transmit the measured values to an evaluation station or to a control room via a bus system or a wireless connection.

* * * * *